United States Patent [19]

Okumura et al.

[11] Patent Number: 5,559,466
[45] Date of Patent: Sep. 24, 1996

[54] SEMICONDUCTOR RELAY FOR TRANSMITTING HIGH FREQUENCY SIGNALS

[75] Inventors: Hisaya Okumura, Kawasaki; Yoshiaki Aizawa, Yokohama, both of Japan

[73] Assignee: Kabushiki Kaisha Toshiba, Kanagawa-ken, Japan

[21] Appl. No.: 279,892

[22] Filed: Jul. 25, 1994

[30] Foreign Application Priority Data

Jul. 29, 1993 [JP] Japan .................. 5-188461

[51] Int. Cl.⁶ .................. H03K 3/42; H03K 17/92; H03K 17/687; G02B 27/00
[52] U.S. Cl. .................. 327/514; 327/369; 327/389; 327/427; 327/436; 250/214 SW; 250/551
[58] Field of Search .................. 327/514, 515, 327/187, 369, 387, 388, 389, 391, 436, 427; 250/551, 208.2, 208.4, 214 R, 214 SW; 361/170, 173, 176

[56] References Cited

U.S. PATENT DOCUMENTS

| | | | |
|---|---|---|---|
| 4,408,131 | 10/1983 | Fox | 327/514 |
| 4,611,123 | 9/1986 | McDonald | 361/173 |
| 4,665,316 | 5/1987 | Hodges | 250/551 |
| 4,742,380 | 5/1988 | Chang et al. | 327/514 |
| 4,864,126 | 9/1989 | Walters et al. | 250/551 |
| 5,045,774 | 9/1991 | Bromberg | 323/322 |
| 5,138,177 | 8/1992 | Morgan et al. | 250/551 |
| 5,146,100 | 9/1992 | Banaska | 250/551 |
| 5,298,817 | 3/1994 | Banak et al. | 327/514 |

OTHER PUBLICATIONS

Bill Gledhill, "It Pays to be Discrete," Electronic Engineering, vol. 43, No. 519, May 1971.

Primary Examiner—David C. Nelms
Assistant Examiner—Trong Phan
Attorney, Agent, or Firm—Finnegan, Henderson, Farabow, Garrett & Dunner, L.L.P.

[57] ABSTRACT

A semiconductor relay has two output MOSFET pairs, each of which is series-connected with the other. Each MOSFET pair is comprised of two MOSFETs series-connected oppositely to each other, and these MOSFETs are controlled to turn on or off simultaneously. The semiconductor relay further includes a switch, which is inserted between the ground and the junction of the two MOSFET pairs. When these MOSFETs are in an off condition, said switch is closed in order to release electric charges accumulated on said MOSFETs and to increase the off-resistance of this semiconductor relay. On the other hand, when the MOSFETs are in an on condition, said switch is opened so as to connect both MOSFET pairs in series. As a result, a semiconductor relay having a high off-resistance can be obtained without increasing the on-resistance.

7 Claims, 10 Drawing Sheets

SEMICONDUCTOR RELAY FOR TRANSMITTING HIGH FREQUENCY SIGNALS

BACKGROUND OF THE INVENTION

1. Field of the Invention

This invention relates to a semiconductor relay, and more specifically to a semiconductor relay for transmitting high frequency signals.

2. Description of the Prior Art

FIG. 1 shows the structure of a prior art semiconductor relay. As shown, this semiconductor relay has a light emitting diode (referred to as LED, below) 101 in its primary side. The secondary side of this relay is comprised of a photo diode array 102 for generating electromotive force on the reception of light emitted by LED 101, a resistor 103, a diode array 104 parallel-connected with resistor 103, an p-channel junction FET (referred to as J-FET, below) 105, and one pair of MOSFETs 106a and 106b series-connected oppositely to each other. Diode array 104 and J-FET 105 form a circuit for discharging the gates of MOSFETs 106a and 106b.

According to the above mentioned structure, photo diode array 102 does not generate a voltage unless LED 101 emits light. In this case, J-FET 105 is held "on" so that the respective substrates and gates of MOSFETs 106a and 106b conduct. This makes both MOSFETs 106 to be "off".

On the contrary, once a current flows through LED 101 and it emits light, photo diode array 102 generates an electromotive force in a forward direction. This makes J-FET 105 to turn off and a positive voltage is applied to the respective gates of MOSFETs 106a and 106b. As a result, both MOSFETs 106a and 106b turn on to connect output terminal 108a with output terminal 108b.

The prior art semiconductor relay mentioned above has the following disadvantage. As far as the relay is in an "off" state, terminals 108a and 108b of MOSFETs 106a and 106b are separated to each other. In this case, a certain capacitance still exists between terminals 108a and 108b. Due to this capacitance, the impedance between terminals 108a and 108b lowers especially for high frequency signals. As a result, terminals 108a and 108b can't be separated completely. This impedance can be calculated from the following equation.

$$Z=1/(2\pi Cf) \tag{1}$$

where C means the capacitance between terminals 108a and 108b and $f$ means the frequency of an input signal.

Assume that C=100 pF and f=10 MHz. In this case, the impedance is 159Ω, which is too small to say that this relay is in a complete "off" state. In order to obtain a sufficiently high impedance, such as 1.59Ω, C must be reduced to about 1 pF.

As shown in FIG. 2, the total capacitance developed across output terminals 108a and 108b is composed of capacitance Cpin, which exists between the package terminals, and junction capacitance 2Cj of MOSFETs 106a and 106b. In usual, Cpin is less than 1 pF while Cj is between scores to hundreds pF. Consequently, the capacitance developed across output terminals depends mainly on the junction capacitance.

Junction capacitance Cj of each MOSFET 106a or 106b arises out of the depletion layer and it is expressed in the following equation.

$$Cj=\epsilon a/l \tag{2}$$

where $\epsilon$ means the dielectric constant of the semiconductor material, a means the junction area, and l means the width of the depletion layer. As is clearly understood from equation (2), depletion layer width l and junction area a should be reduced in order to reduce Cj. The on-resistance of a MOSFET, however, increases as width l and junction area a reduce. This is understood from the following equation.

$$Ron=\rho l/a \tag{3}$$

where $\rho$ means the resistivity of the semiconductor material.

On the other hand, the width of the depletion layer determines the withstand voltage of a MOSFET. Accordingly, the area of the junction determines the resistance of the MOSFET, as far as the same kind of semiconductor material is used. FIG. 3 is a graph showing the correlation among the capacitance of the output terminals, the on-resistance, and the chip size of MOSFETs. As is clearly understood from the above mentioned explanation, the on-resistance increases as the chip size decreases. On the contrary, the capacitance of the output terminals increases as the chip size increases. In usual, the product of an output terminal capacitance and an on-resistance is used as the performance index of a semiconductor relay.

FIG. 4 is a graph showing the correlation between the product mentioned above and the chip size. As is easily understood from this figure, the total performance of the prior art relay has not been improved even if the junction area has been changed. In this case, the chip size is almost proportional to the junction area.

As mentioned above, two basic requirements for semiconductor relays, which are to reduce the on-resistance and to increase the off-resistance of this relay, oppose each other due to the technical reason.

SUMMARY OF THE INVENTION

This invention has been made to overcome the above mentioned problem of the prior art semiconductor relay.

Therefore, one objective of the present invention is to provide a semiconductor relay, which is capable of reducing its output capacitance without increasing its on-resistance.

Another objective of the present invention is to realize a semiconductor relay, which has a high off-resistance in spite that it has a low on-resistance, by adding only a simple circuit.

In order to accomplish the above mentioned objective, the semiconductor relay according to the present invention has two MOSFET pairs 60 and 61, and a switch 8 at the output side as shown in FIG. 5. Each MOSFET pair includes two MOSFETs that are series-connected oppositely to each other. In addition, two MOSFET pairs 60 and 61 are connected in series across output terminals 7a and 7b. Switch 8 is inserted between the junction of two MOSFET pairs and the ground. In this relay, switch 8 provides the MOSFETs with an electric path for discharging unnecessary charges accumulated on them. The semiconductor relay of this invention further has means (not shown in FIG. 5) for turning on or off said MOSFETs simultaneously.

According to the structure mentioned above, electric charges accumulated across output terminals are discharged through switch 8 when the semiconductor relay is in an off state. This reduces the output capacity of this relay. As a result, the relay of this invention can increase its off-resistance without increasing its on-resistance.

These and other objectives, features, and advantages of the present invention will be more apparent from the following detailed description of the preferred embodiments in conjunction with the accompanying drawings.

DETAILED DESCRIPTION OF PREFERRED EMBODIMENTS

Figure 1:
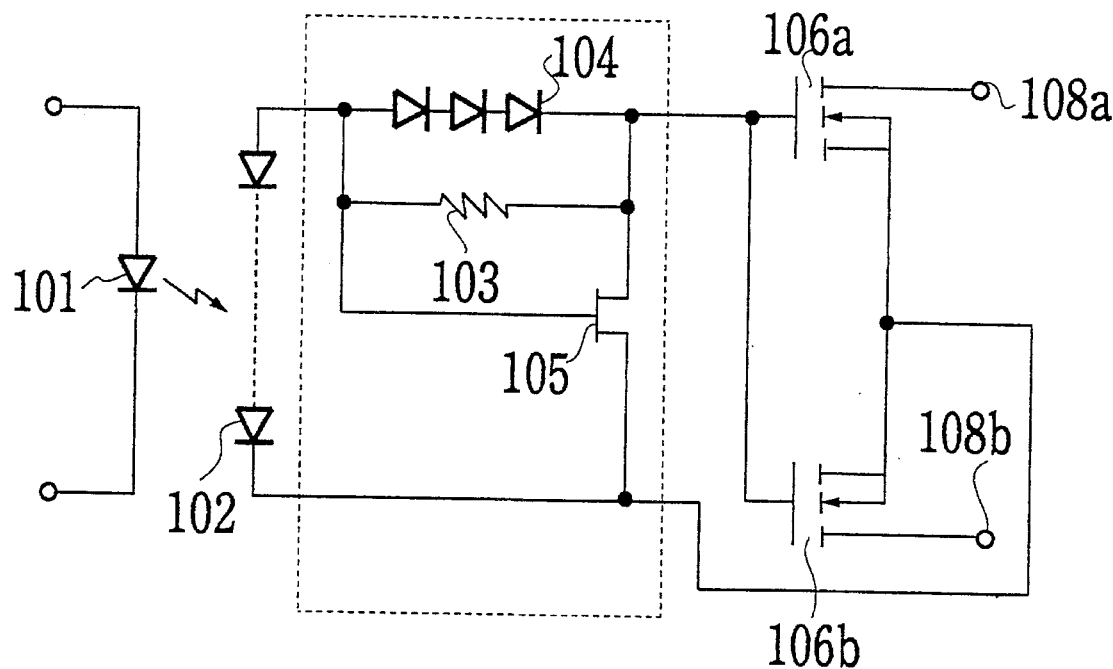
FIG. 1 is a circuit diagram of a prior art semiconductor relay.
Figure 2:
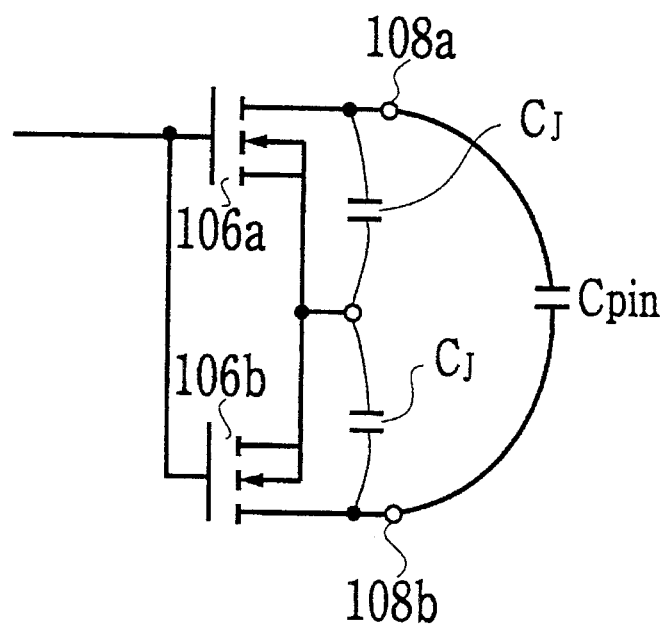
FIG. 2 is a view for explaining the output capacitance developed across output terminals.
Figure 3:
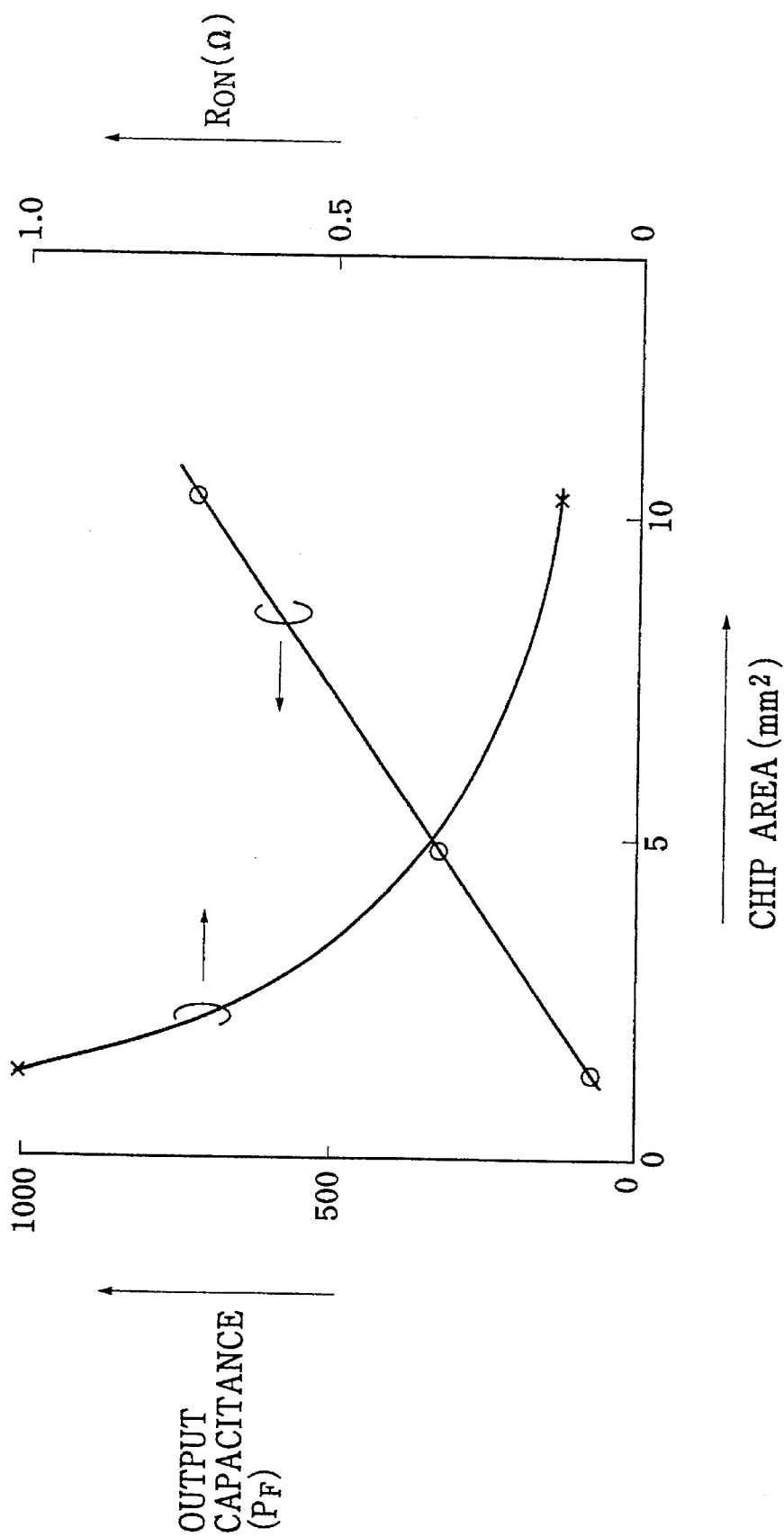
FIG. 3 is a graph showing the correlation among the output capacitance, the on-resistance, and the chip size of the prior art semiconductor relay.
Figure 4:
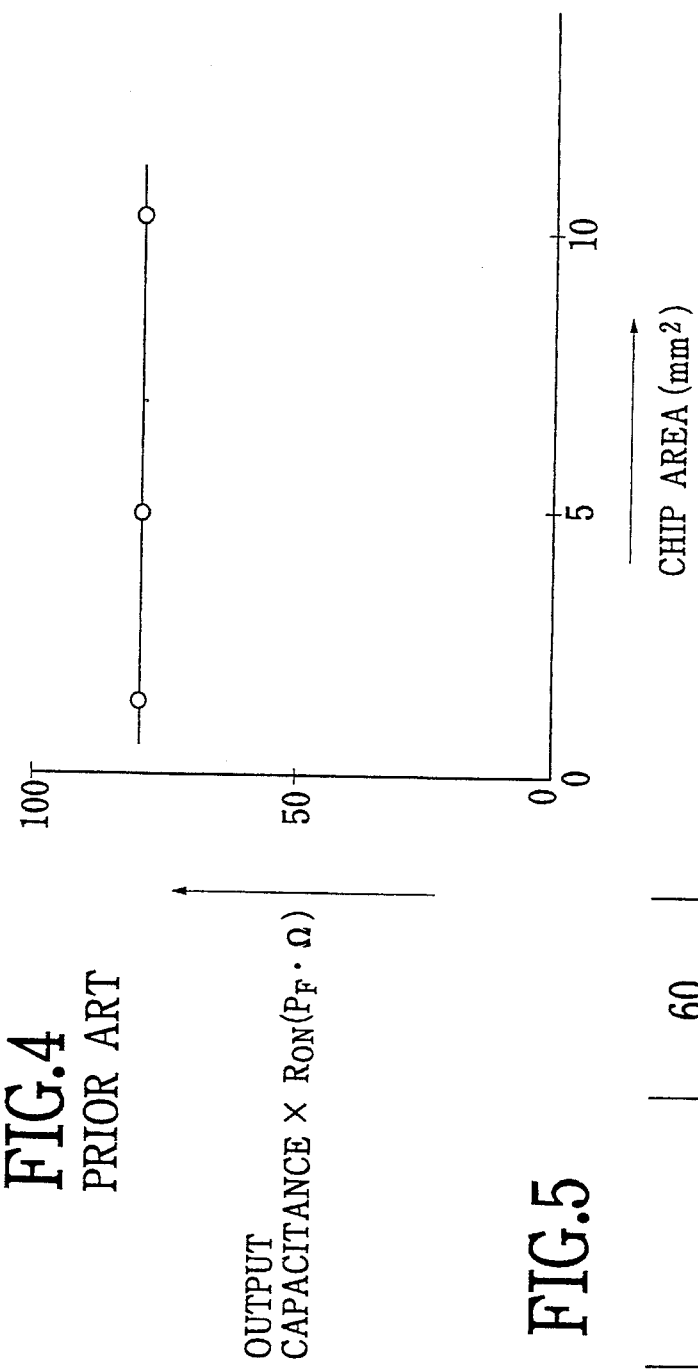
FIG. 4 is a graph showing the correlation between the chip size and the product of the output capacitance and the on-resistance in the prior art semiconductor relay.
Figure 5:
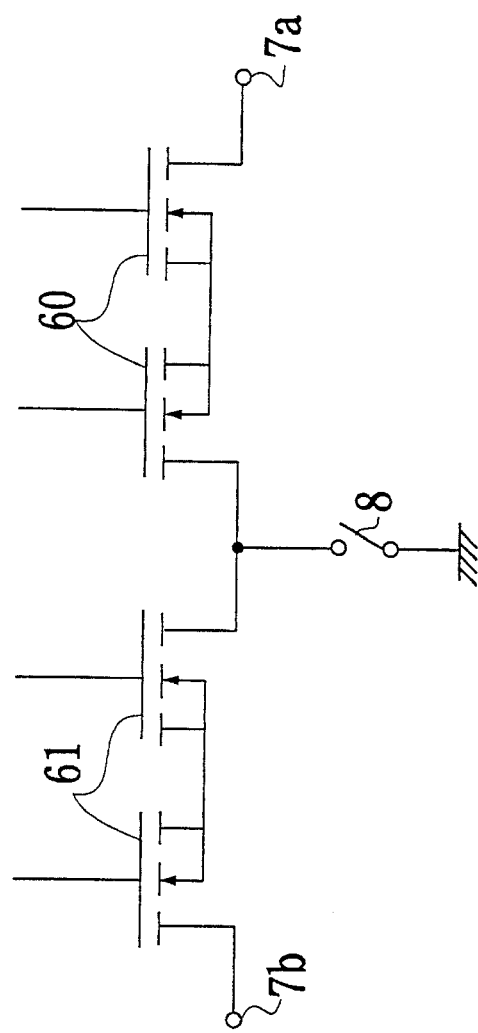
FIG. 5 is a view showing the basic concept of the present invention.
Figure 6:
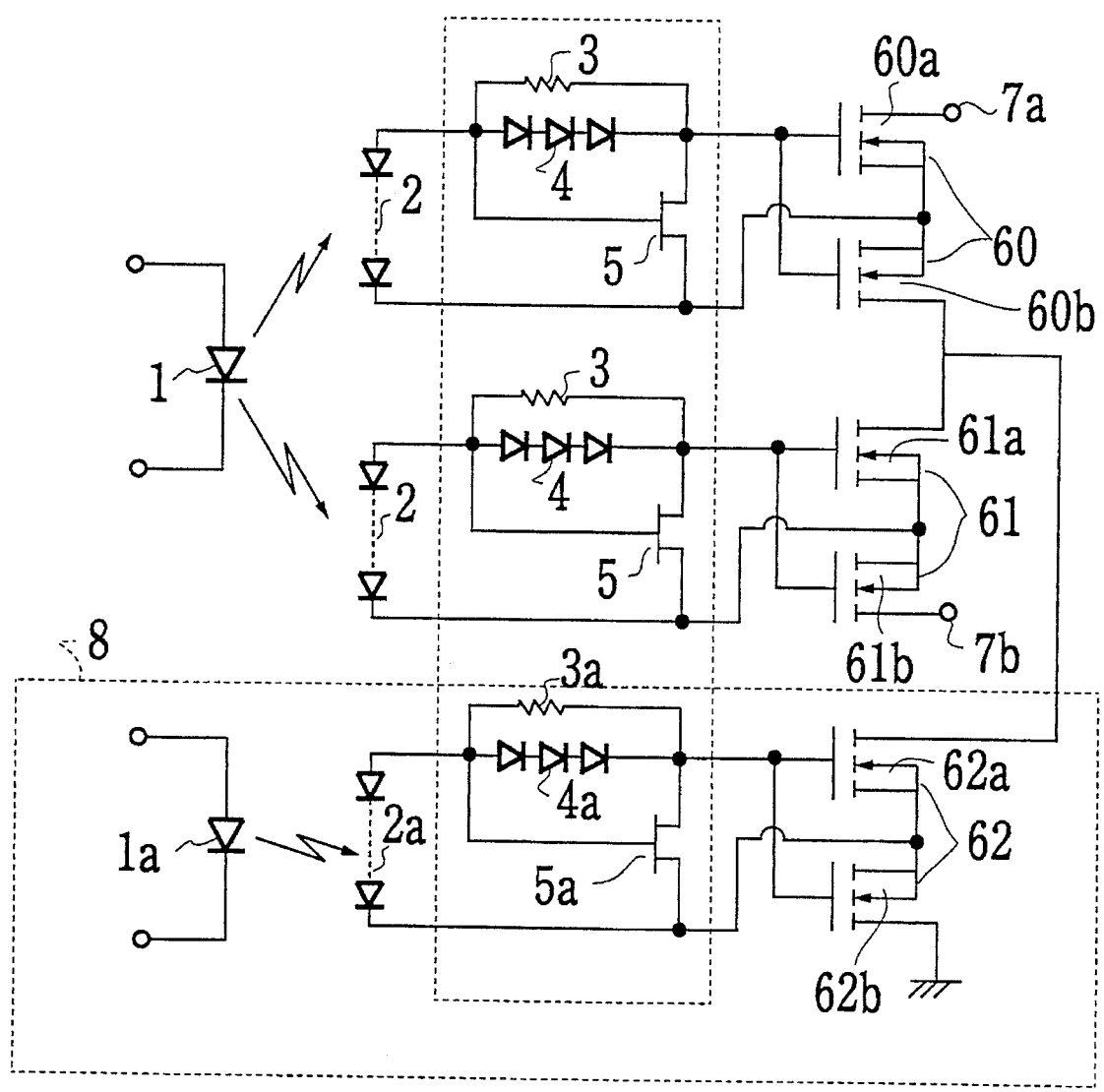
FIG. 6 is a circuit diagram of a semiconductor relay according to the first embodiment of the present invention.

A semiconductor relay is shown in FIG. 6 according to the first embodiment of the present invention. This relay has an LED 1 in the primary side. The secondary side of this relay includes four output MOSFETs 60a, 60b, 61a, and 61b. In this embodiment, n channel MOSFETs of an enhancement type are used as output MOSFETs 60a to 61b. As shown, MOSFETs 60a and 60b (first pair 60) are connected in series-opposite with each other. In the same manner, MOSFETs 61a and 61b (second pair 61) are connected in series-opposite with each other. In addition, these two MOSFET pairs 60 and 61 are connected in series with each other and inserted between output terminals 7a and 7b of this relay. Further, each pair of MOSFETs is provided with a driving circuit, which is comprised of a photo diode array 2, a resistor 3, a diode array 4 series-connected with resistor 3, and an p channel J-FET 5. Photo diode arrays 2 in these driving circuits are activated simultaneously with the light emitted by LED 1, and therefore, MOSFETs in the first and second pairs 60 and 61 are controlled simultaneously to be on or off. Each pair of resistor 3 and diode array 4 makes up a discharging circuit for the corresponding gate of MOSFETs 60a to 61b.

This embodiment is characterized by the fact that a grounded semiconductor relay 8 is further connected to the junction of the first and second MOSFET pairs 60 and 61. As shown, relay 8 is comprised of an LED 1a, two output MOSFETs 62a and 62b, a photo diode array 2a, a resistor 3a, a diode array 4a, and an n channel J-FET 5a. In this relay, LED 1 and LED 1a are controlled to be on or off independently.

According to this embodiment shown in FIG. 6, no voltage is developed across photo diode arrays 2 unless LED 1 emits light. In this case, as J-FETs 5 keep an on condition, the respective gates and substrates of the MOSFETs conduct. This makes MOSFETs 60a to 61b to be off. On the other hand, when LED 1 emits light towards photo diode arrays 2 by being activated with a current, each photo diode array 2 generates a voltage in the forward direction. This makes J-FETs 5 to be an off condition, so that a positive voltage is applied to each gate of the MOSFETs. As a result, MOSFET 60a to 61b turn on to connect output terminal 7a with output terminal 7b. The basic operation of this relay is the same as that of the prior art relay explained above.

Next, the operation of grounded semiconductor relay 8 will be explained below in order to clarify the characteristics of this invention.

In usual, the output capacity developed across output terminals of a semiconductor relay reduces the off-resistance of this relay. This means that electric charges accumulated across the output terminals work as a medium for transmitting high frequency signals. In this invention, therefore, LED 1a is activated to emit light and to turn on grounded semiconductor relay 8 during that LED 1 in the output relay is not activated, that is, the output relay is in an off condition. In this case, the electric charges accumulated on MOSFETs 60a to 61b are released because that output terminals 7a and 7b are connected to the ground through relay 8. As a result, no matter how high the frequency is, signals can't pass output terminals 7a and 7b. Consequently, the off-resistance of this relay increases.

On the other hand, during that the output relay is in an on condition, that is, LED 1 is emitting light, no current is supplied to LED 1a so as to turn off grounded semiconductor relay 8. In this case, output terminals 7a and 7b are connected with each other.

As mentioned above, the semiconductor relay of this embodiment makes semiconductor relay 8 to conduct only when the output relay is in an off condition, in order to release excessive charges accumulated across the output terminals. This results in the reduction of the total off-resistance of this semiconductor relay.

Figure 7:
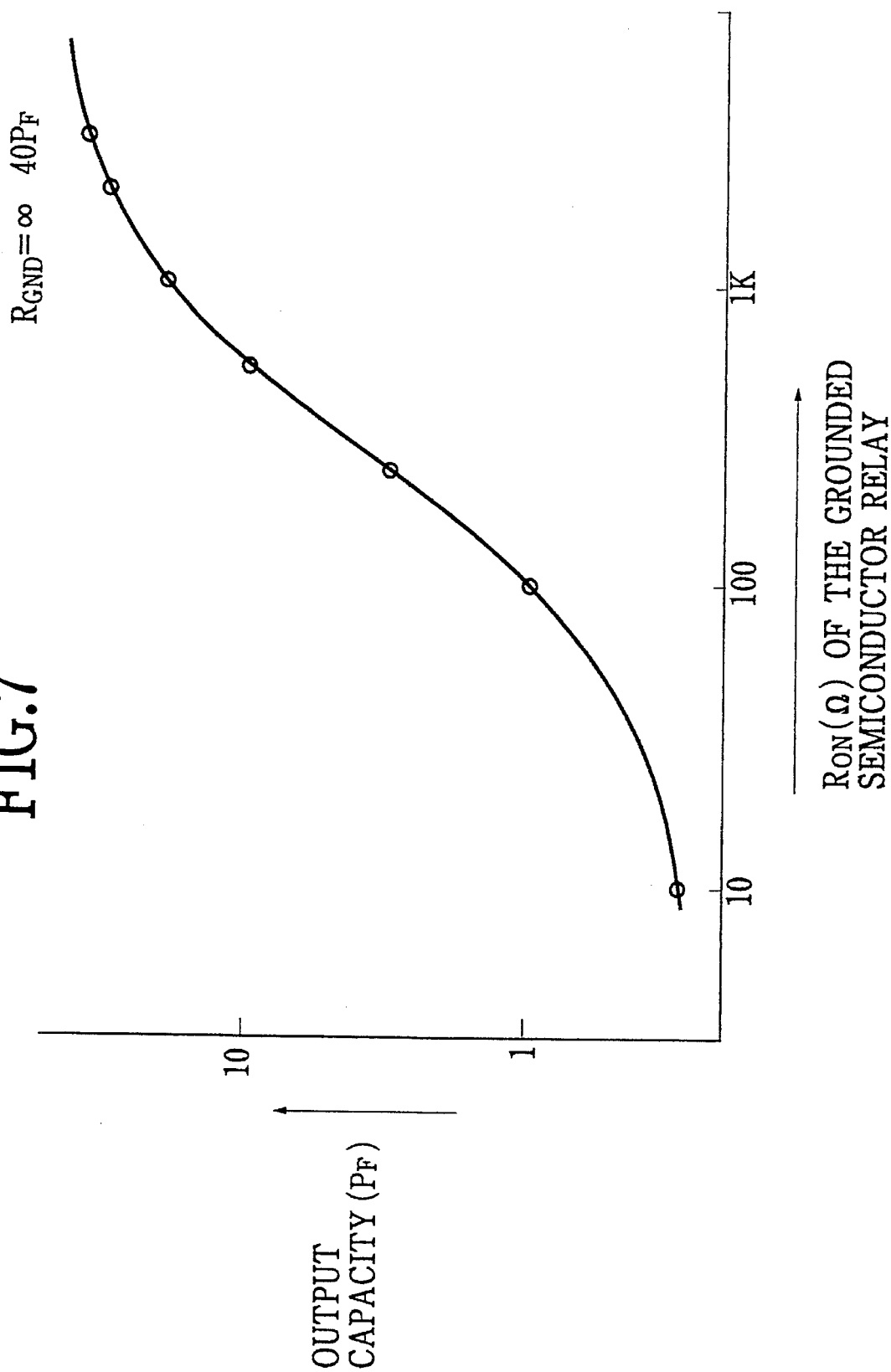
FIG. 7 is a graph showing the correlation between the on-resistance of the grounded semiconductor relay shown in FIG. 6 and the output capacity in the case where the output terminals shown in FIG. 6 are in an off condition.

In said semiconductor relay, the on-resistance of relay 8 should be kept low enough in order to completely release electric charges from the respective output terminals. In FIG. 7, the correlation is shown between the on-resistance of relay 8 and the output capacitance of the entire semiconductor relay when this relay is in an off condition. As is clearly understood from the figure, the on-resistance of relay 8 should be kept below 100Ω so as to keep the output capacitance less than 1 pF.

Figure 8:
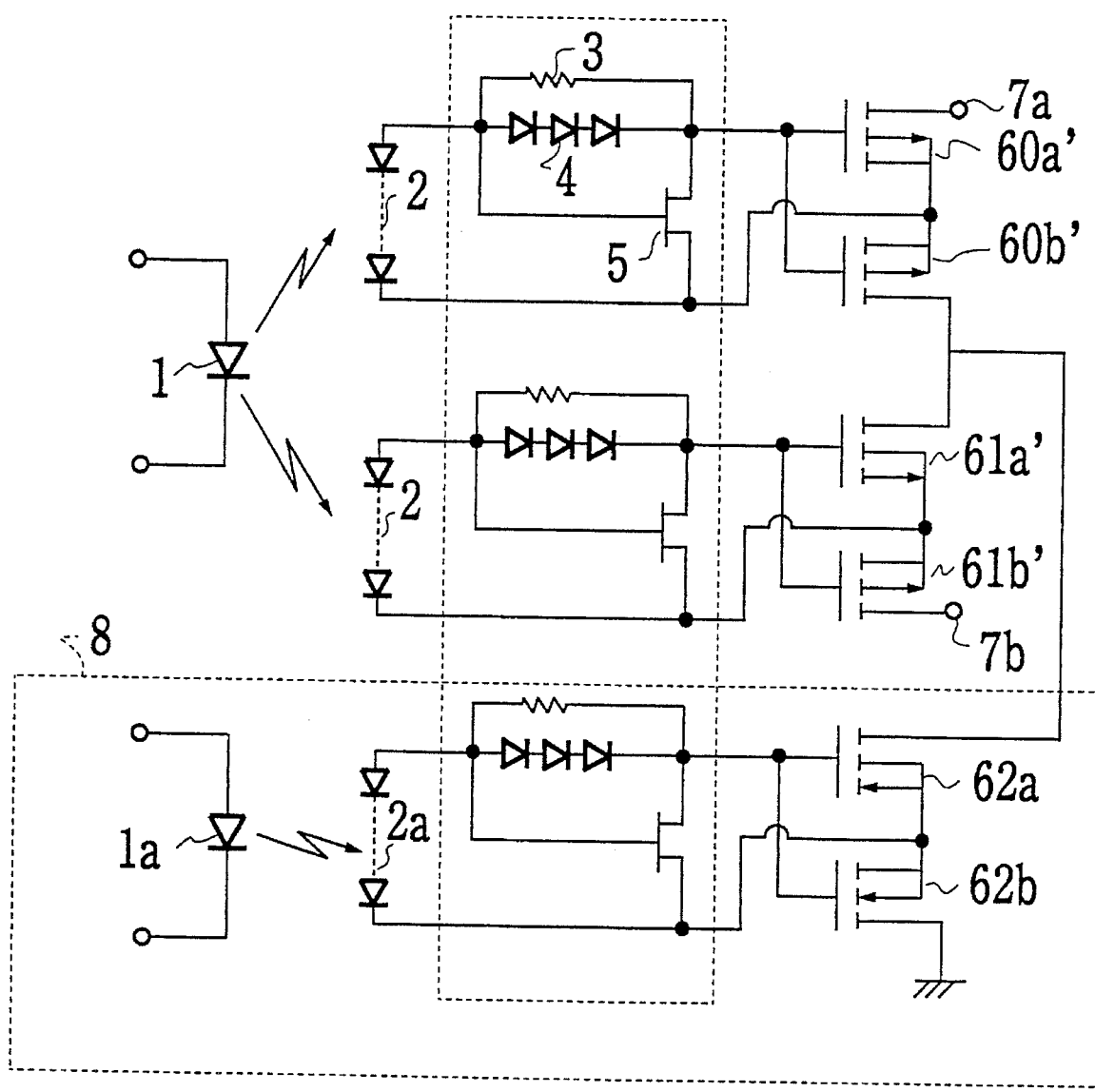
FIG. 8 is a circuit diagram of a semiconductor relay according to the second embodiment of the present invention.

In FIG. 8, the structure of a semiconductor relay is shown according to the second embodiment of the present invention. The semiconductor relay of this embodiment has the same structure as that of the first embodiment except that MOSFETs 60$a'$ to 61$b'$ are in a depletion mode. In this case, MOSFETs 60$a$ to 61$b$ turn off when LED 1 emits light, while they turn on when LED 1 does not emit light. This embodiment can, therefore, use LED 1 to be the light source not only for photo diode arrays 2 but for photo diode array 2$a$ in relay 8. This means that the third embodiment does not need an LED which activates only photo diode array 2$a$ in grounded semiconductor relay 8.

Figure 9:
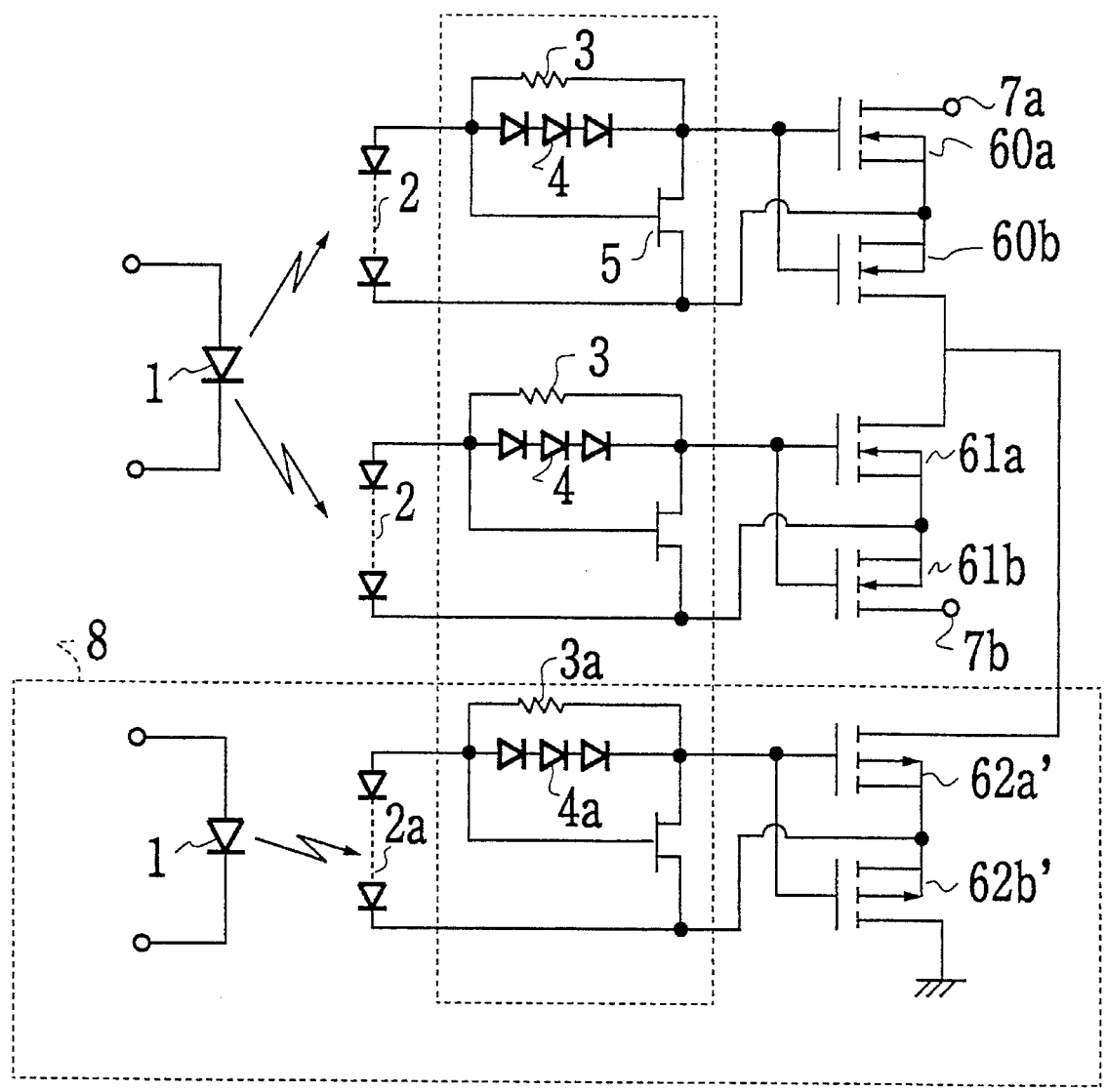
FIG. 9 is a circuit diagram of a semiconductor relay according to the third embodiment of the present invention.

In FIG. 9, the structure of a semiconductor relay is shown according to the third embodiment of the present invention. The semiconductor relay of this embodiment has the same structure as that of the first embodiment except that MOSFETs 62$a'$ and 62$b'$ in grounded semiconductor relay 8 are in a depletion mode. In this case, MOSFETs 60$a'$ and 62$b'$ turn off when LED 1 emits light, while they turn on when LED 1 does not emit light. As a result, instead of LED 1$a$ in relay 8, LED 1 in the output relay can also be utilized to activate the photo diode array 2$a$ in relay 8.

Figure 10:
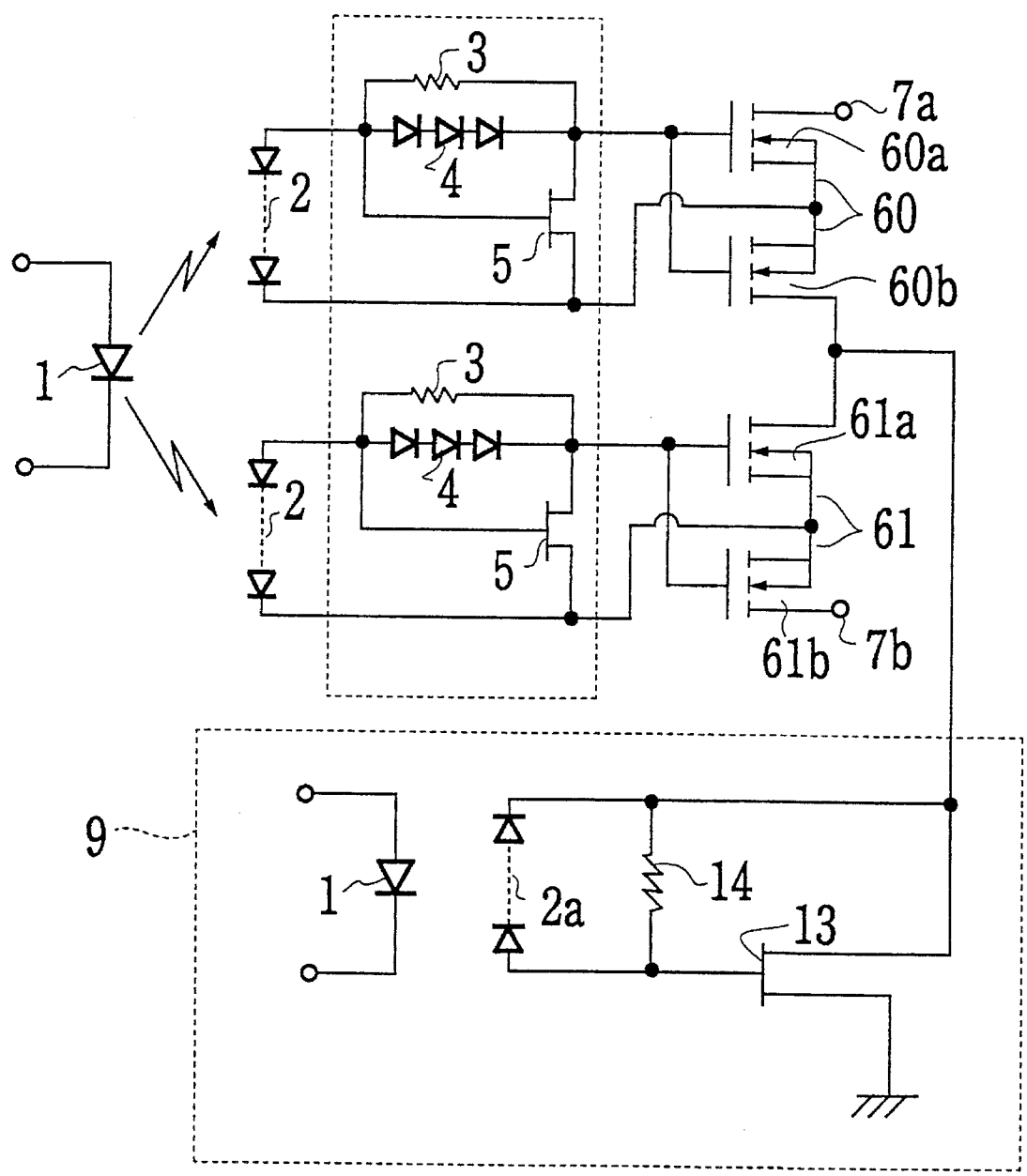
FIG. 10 is a circuit diagram of a semiconductor relay according to the fourth embodiment of the present invention.

In FIG. 10, the structure of a semiconductor relay is shown according to the fourth embodiment of the present invention. In this embodiment, grounded semiconductor relay 9 is comprised of a photo diode array 2$a$, a J-FET 13 whose gate is connected to the minus side of photo diode array 2$a$, and a resistor 14. In this case, MOSFETs 60$a$ to 61$b$ in the output (main) relay turn off when LED 1 emits light, while they turn on when LED 1 does not emit light. On the contrary, J-FET 13 turns on when LED 1 emits light, while it turns off when LED 1 does not emit light. As a result, LED 1 in the output relay can be utilized to be the light source for activating not only photo diode arrays 2 but photo diode array 2$a$ in relay 9 as well.

Figure 11:
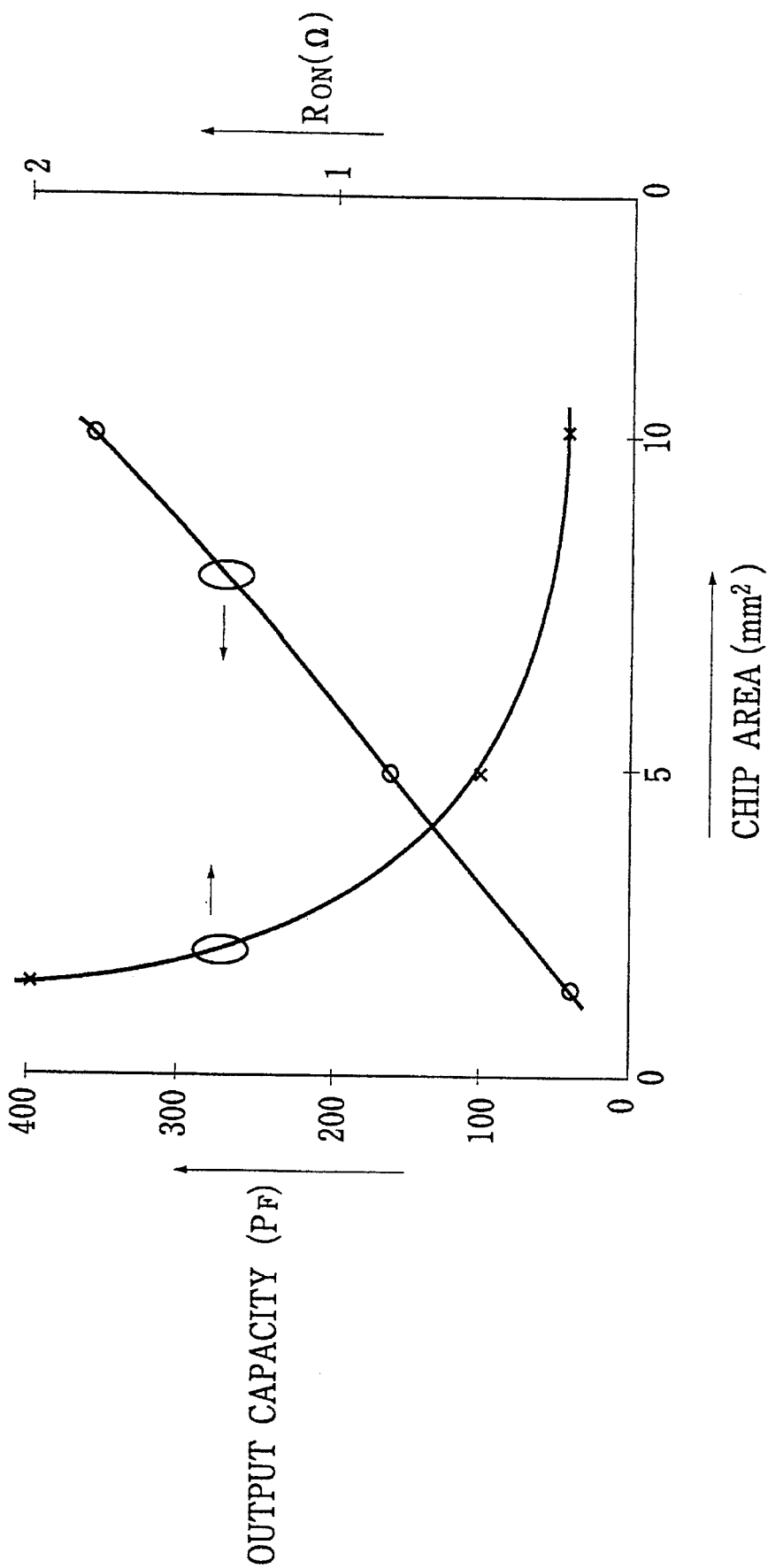
FIG. 11 is a graph showing the correlation between the output capacitance and the on-resistance, and between the output capacitance and the chip size of a semiconductor relay according to one embodiment of the present invention.
Figure 12:
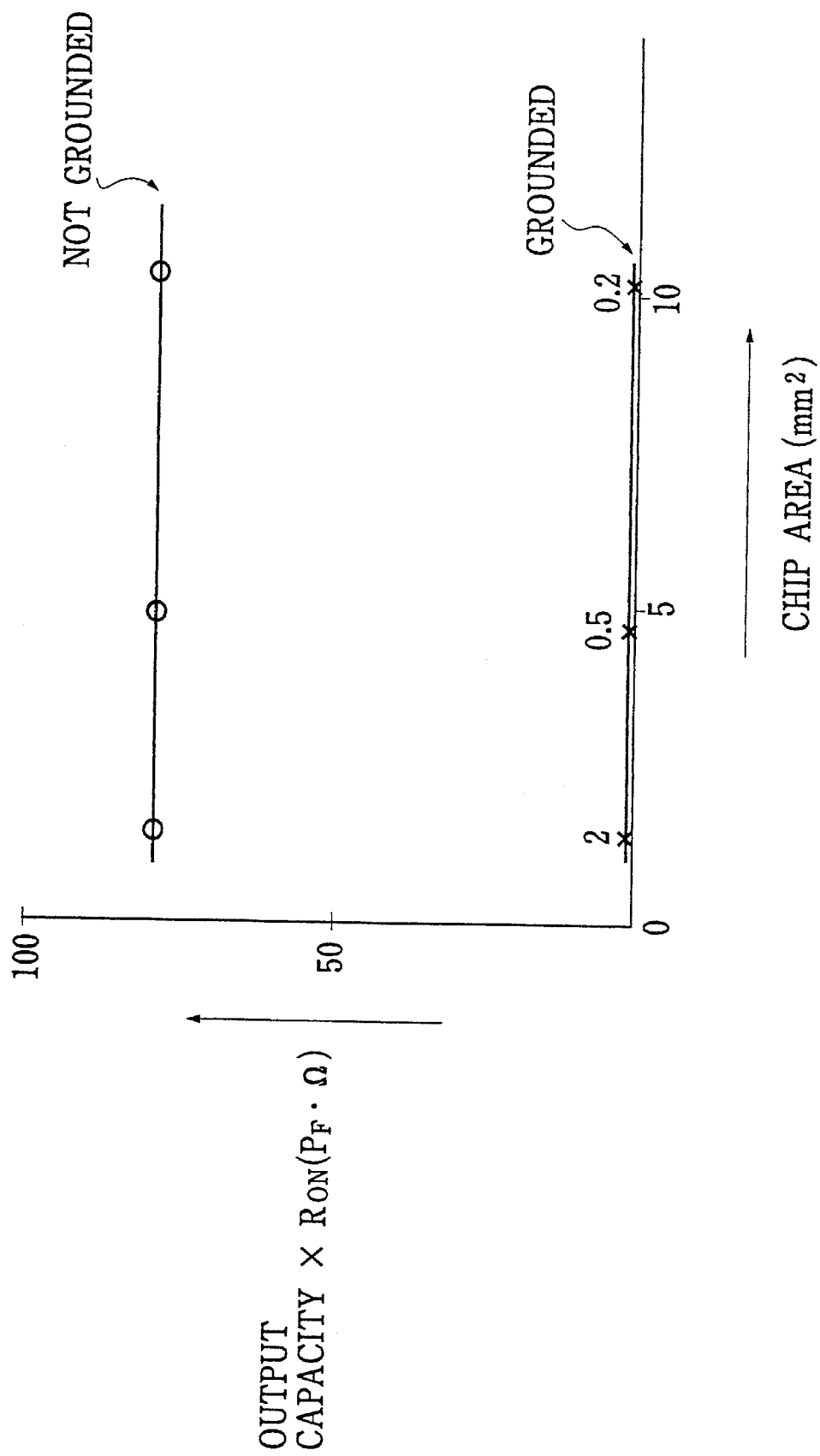
FIG. 12 is a graph showing the correlation between the chip size and the product of the output capacitance and the on-resistance of a semiconductor relay according to one embodiment of the present invention.

FIG. 11 shows the correlation among the output capacitance, the on-resistance Ron, and the chip size of the relay according to the present invention. This invention has four MOSFETs inserted in series across the output terminals. Accordingly, the on-resistance of this relay is two times as much as that of the prior art devices while the output capacitance is one half that of the prior art device. However, due to the existence of the grounded semiconductor relay having an on-resistance of 100Ω, the output capacitance decreases to 1 pF. As a result, the product of (output capacitance) and (on-resistance Ron) decreases enormously, that is, from 80 pF.Ω of the prior art relay, to 2 pF.Ω, as shown in FIG. 12. This means that the total performance of the relay according to this invention can be greatly improved as compared with the prior art device. If the grounded semiconductor relay includes MOSFETs in an enhancement mode, the on-resistance of this relay can be reduced below 10Ω. In this case, the product (output capacitance) and (Ron) decreases to 0.6 pF.Ω, which is less than 1/100 that of the prior art device.

What is claimed is:

1. A semiconductor relay, comprising:

a first pair of MOSFETs including first and second MOSFETs oppositely connected in series with each other via a first connection point, said first and second MOSFETs each having a gate;

a second pair of MOSFETs including third and fourth MOSFETs oppositely connected in series with each other via a second connection point, said third and fourth MOSFETs each having a gate;

means for simultaneously turning on or turning off said first and second MOSFET pairs by applying a control signal between the gates of the first and second MOSFETs and said first connection point, and applying said control signal between the gates of the third and fourth MOSFETs and said second connection point; and a switch which is inserted between a ground conductor and a junction between said first and second MOSFET pairs.

2. The semiconductor relay as claimed in claim 1, wherein said switch connects said junction with the ground conductor when said first and second MOSFET pairs are off, while said switch separates said junction from the ground conductor when said first and second MOSFET pairs are on.

3. The semiconductor relay as claimed in claim 1, wherein said switch is a semiconductor switch.

4. The semiconductor relay as claimed in claim 1, wherein said switch is comprised of two MOSFETs series-connected oppositely.

5. The semiconductor relay as claimed in claim 1, wherein said switch is comprised of two MOSFETs of a bi-directional type.

6. The semiconductor relay as claimed in claim 1, wherein said switch is comprised of a junction FET.

7. The semiconductor relay as claimed in claim 1, wherein said means for simultaneously turning on or off said first and second MOSFET pairs is driven by an electromotive force produced by a photo diode array which is activated by a light emitting diode.

\* \* \* \* \*